(12) United States Patent
Scade et al.

(10) Patent No.: US 7,675,775 B2
(45) Date of Patent: Mar. 9, 2010

(54) COMBINED VOLATILE NONVOLATILE ARRAY

(75) Inventors: Andreas Scade, Dresden (DE); Stefan Guenther, Dresden (DE)

(73) Assignee: Cypress Semiconductor Corporation, San Jose, CA (US)

( * ) Notice: Subject to any disclaimer, the term of this patent is extended or adjusted under 35 U.S.C. 154(b) by 25 days.

(21) Appl. No.: 11/999,684

(22) Filed: Dec. 5, 2007

(65) Prior Publication Data

US 2009/0147578 A1 Jun. 11, 2009

(51) Int. Cl.
*G11C 14/00* (2006.01)
(52) U.S. Cl. .................. 365/185.08; 365/185.21; 365/185.33; 365/185.23
(58) Field of Classification Search ............ 365/185.08, 365/185.21, 185.33, 185.23, 205, 207
See application file for complete search history.

(56) References Cited

U.S. PATENT DOCUMENTS

| | | | |
|---|---|---|---|
| 7,280,397 B2 * | 10/2007 | Scheuerlein | 365/185.08 |
| 7,295,475 B2 | 11/2007 | Akaogi et al. | |
| 7,333,363 B2 * | 2/2008 | Nakai et al. | 365/185.08 |
| 7,423,912 B2 * | 9/2008 | Perlegos et al. | 365/185.24 |
| 7,499,322 B2 * | 3/2009 | Lee et al. | 365/185.08 |
| 2006/0261401 A1 | 11/2006 | Bhattacharyya | |
| 2007/0045711 A1 | 3/2007 | Bhattacharyya | |

OTHER PUBLICATIONS

International Search Report of International Searching Authority, dated Jan. 14, 2009 for International U.S. Appl. No. PCT/US08/85688; 2 pages.
International Written Opinion of International Searching Authority, dated Jan. 14, 2009 for International U.S. Appl. No. PCT/US08/85688; 4 pages.
Benini et al. "Energy-Adware Design of Embedded Memories: A Survey of Technologies, Architectures, and Optimization Techniques." In: ACM Transactions on Embedded Computing Systems (TECS) [online], vol. 2, No. 1, Feb. 2003, pp. 5-32 [retrieved on Jan. 9, 2009]. Retrieved from the Internet: <URL:http://www.dii.unisi.it/-giorgi/didattica/lp_ca/references/Benini03-ACMTECS-Energy_Aware%20Design%20of%20Embedded%20memories%20a%20survey%20of%20technologies.pdf>, entire document; 28 pages.

* cited by examiner

*Primary Examiner*—David Lam

(57) ABSTRACT

A memory circuit includes volatile memory cells coupled to bit lines, and nonvolatile memory cells coupled to the volatile memory cells via the bit lines but not via complement bit lines.

21 Claims, 8 Drawing Sheets

US 7,675,775 B2

COMBINED VOLATILE NONVOLATILE ARRAY

TECHNICAL FIELD

The present disclosure relates to combined volatile and nonvolatile memory circuits.

BACKGROUND

High speed volatile and non-volatile storage of data is an important feature in computer systems. Present solutions use specialized volatile memory technologies, like DRAM and SRAM with non volatile back up memories, such as BBSRAM, EEPROM and FLASH. In case of power loss significant amounts of volatile data may have to be stored in the non-volatile memory. This is typically done via signaling interfaces between volatile and nonvolatile memory regions, the interfaces having limited parallelism, high current requirements, and possibly using multiple processor cycles to manage the data transfer. A faster and less power intensive solution is nvSRAM memories, where each volatile cell is paired with a non-volatile cell and data may pass from one region to another without first being placed on a bus or other signaling interface. One disadvantage of present nvSRAM circuits is their limited density and relatively large memory cell size, typically involving twelve high and low voltage transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Figure 1:
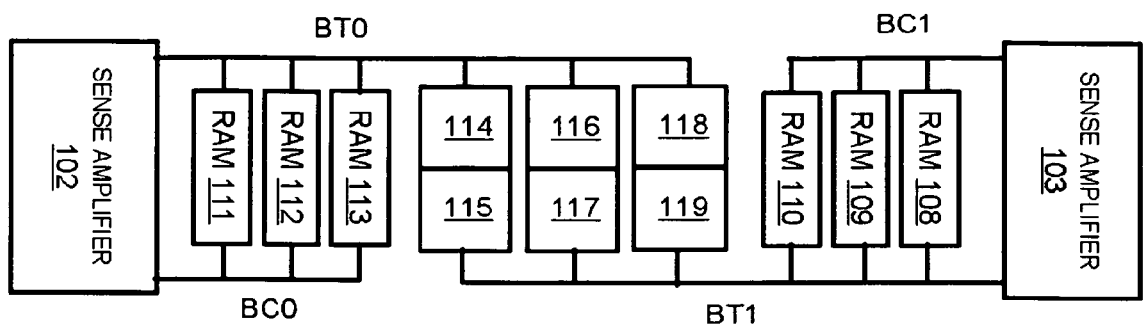
FIG. 1 is a block diagram of an embodiment of an integrated non-volatile static random access memory array.

FIG. 1 is a block diagram of an embodiment of an integrated non-volatile static random access memory array. The array comprises volatile memory cells 108-113, which may be SRAM memory cells, DRAM memory cells, or other volatile memory technology. The array comprises non-volatile memory cells 114-119, in this embodiment flash memory cells. The array comprises sense amplifiers 102 and 103. Data is communicated to and from the volatile and non-volatile cells 108-119 using bit lines BT0 and BT1 and their compliment lines BC0 and BC1. The sense amps 102 and 103 drive the bit lines and their complements to unambiguous values when reading data from the cells.

Each volatile memory cell 108-113 has an associated non-volatile cell 114-119 which may be used to store the information in the associated volatile cell. Thus each volatile cell 108-113 has a "backup" non-volatile cell 114-119. For example, cell 108 may have a non-volatile "backup" cell 115. Cell 109 may have a "backup" cell 117, and so forth. The same bit lines and compliment lines BT0, BT1, BC0, BC1 are used to insert data into and obtain data from some number of volatile cells. The bit lines BT0, BT1 together with the Vc0/Vc1 lines are used to insert data into or obtain data from their non-volatile associated cells.

Insertion of data into volatile cells 108-113 is performed using WRITE operations. Obtaining of data from volatile cells 108-113 is performed with READ operations. Insertion of data from volatile cells 108-113 or from the data bus via the sense amplifier to non-volatile cells 114-119 is performed using STORE operations. Obtaining data from non-volatile cells 114-119 is performed with RECALL operations. Clearing data stored in the FLASH cells is performed with ERASE operations.

In FIG. 1, three volatile/nonvolatile pairs are shown associated with each bit line BT0 or BT1, but in fact any practical number of cells pairs may be associated with a particular bit line, according to the application. Each grouping of cells associated with a particular bit line may be referred to as a column. Various embodiments may comprise more or fewer cells per column. Typically, only one cell per bit line may be operated on simultaneously. The cell of a column to operate on is selected using a signal called a "word line", WL. A WL may select cells from a number of columns simultaneously; these columns form one or more memory words, and the number of columns in a memory word may be referred to as the "word width" or "page size".

Figure 2:
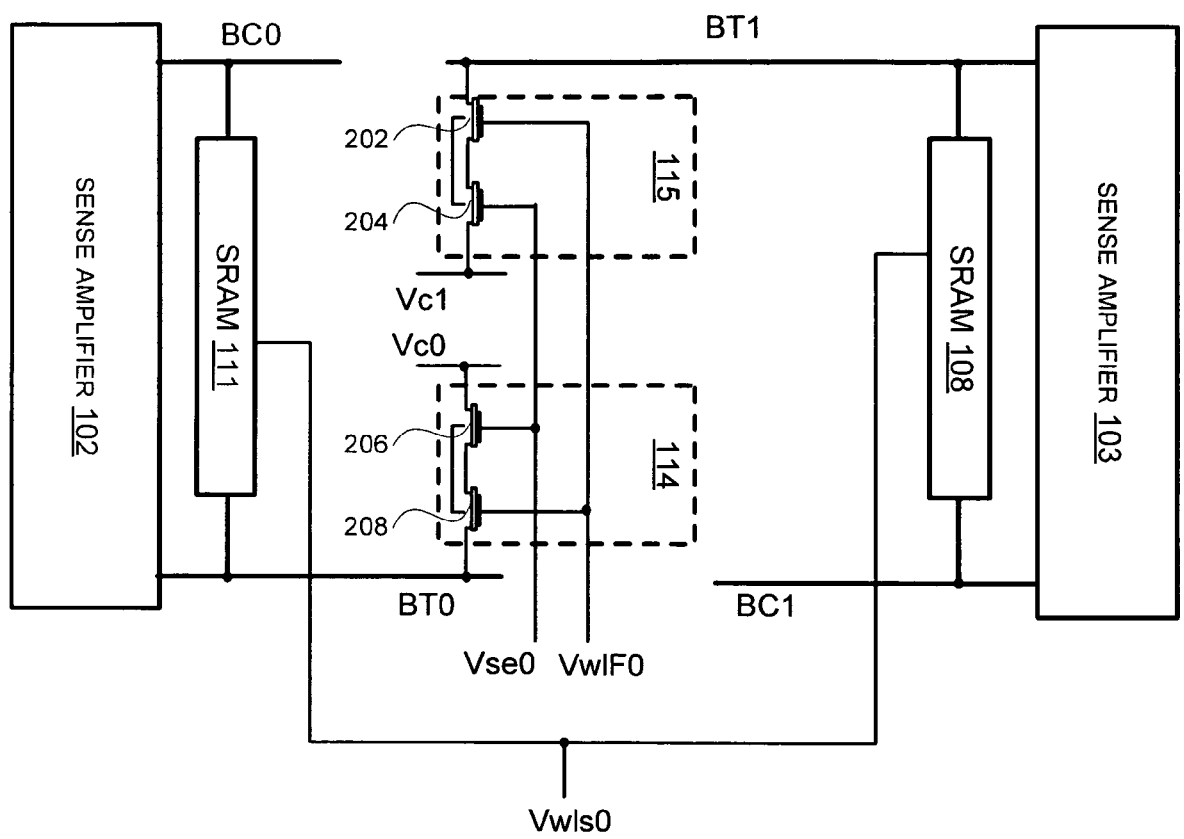
FIG. 2 illustrates in more detail an embodiment of an integrated non-volatile static random access memory array.

FIG. 2 illustrates in more detail an embodiment of an integrated non-volatile static random access memory array. SRAM 111 is associated with a non-volatile flash cell 114 comprising transistors 206 and 208 (as an example). SRAM 108 is associated with a non-volatile flash cell 115 comprising transistors 202 and 204 (as an example). Word line Vwls0 is in this embodiment a common control to both volatile cells 108 111 and therefore both cells are part of the same memory word and/or page.

Non-volatile charge storage is accomplished in this embodiment of a FLASH cell at all gates connected with Vse0. In prior designs a differential approach is taken to sensing the charge stored in both the volatile and nonvolatile cells. The sense amplifiers sense differential voltage on the bit lines and their complements and drive the difference to an unambiguous result representing the bit value. In this embodiment the sense amplifiers 102 103 may use a nondifferential approach at least for the nonvolatile cells 114 115, which are each coupled only to a bit line, not a complement bit line. Bit value detection may be facilitated by controlling Vc0 and Vc1 according to the value sensed on the corresponding bit line. The number of transistors in each nonvolatile cell 114 115 may be reduced for example from six per cell, to three or two (as shown) per cell, due at least in part to removing control and isolation transistors between volatile and nonvolatile regions as well as Vcc (a high supply voltage).

Transistors of the flash cells 114 115 may in some embodiments comprise SONOS (silicon-oxide-nitride-oxide semiconductor) technology. Data is communicated between volatile cell 111 and flash cell 114 using bit line BT0. Control lines VwlF0, Vwls0, Vc0, and Vse0 control the transfer of data to and from flash cell 114. Data is communicated between volatile cell 108 and flash cell 115 using bit line BT1. Control lines VwlF0, Vwls0, Vc1, and Vse0 control the transfer of data to and from flash cell 115. Non-volatile STORE operations on flash memory may require medium (relative low) voltages Vc0 and Vc1, leaving Vse0 as the only high voltage node. RECALL is a low voltage operation and at ERASE all nodes are low voltage except for Vse0. Word line VwlF0 is a common control to both flash cells 114 115 and therefore both cells are part of the same memory word and/or page.

The medium control voltages Vc0 Vc1 for the flash cells 114 115 are isolated from the corresponding volatile cells 111 108, which operate using comparatively low-voltages. The areas of the memory comprising flash memory cells 114 115 and nonvolatile cells 111 108 may therefore be fabricated with higher density than would be the case if high, medium and low voltage areas were more integrated. The bit lines BT0 and BT1 are used to communicate data between volatile and nonvolatile cells, increasing performance over systems that employ external bus interfaces between volatile and nonvolatile regions.

Thus, the memory circuit includes volatile memory cells coupled to bit lines, and nonvolatile memory cells coupled to the volatile memory cells via the bit lines but not via other couplings found in prior solutions, such as control and isolation transistors. Consequently, the number of transistors in the non-volatile cells may be reduced to two from six or more. In this example, SONOS (204, 206) and medium voltage (202, 208) transistors implement the nonvolatile cells, respectively. Other possible implementations may involve one SONOS and two medium-voltage transistors per nonvolatile cell, and/or a floating gate NOR structure.

In the illustrated embodiment, the volatile cells are implemented by SRAM cells coupled to the bit lines and to complements of the bit lines, whereas the nonvolatile cells are flash cells coupled to the bit lines only. The possible implementations could include DRAM and are not specific to using SRAM for the volatile cells. Each non-volatile cell is coupled to multiple volatile cells via a particular bit line, and coupled to a non-volatile word line corresponding to a volatile word line coupled to only one of the volatile cells on the particular bit line to which the nonvolatile cell is coupled, effectively pairing each nonvolatile cell with a single volatile cell.

Figure 3:
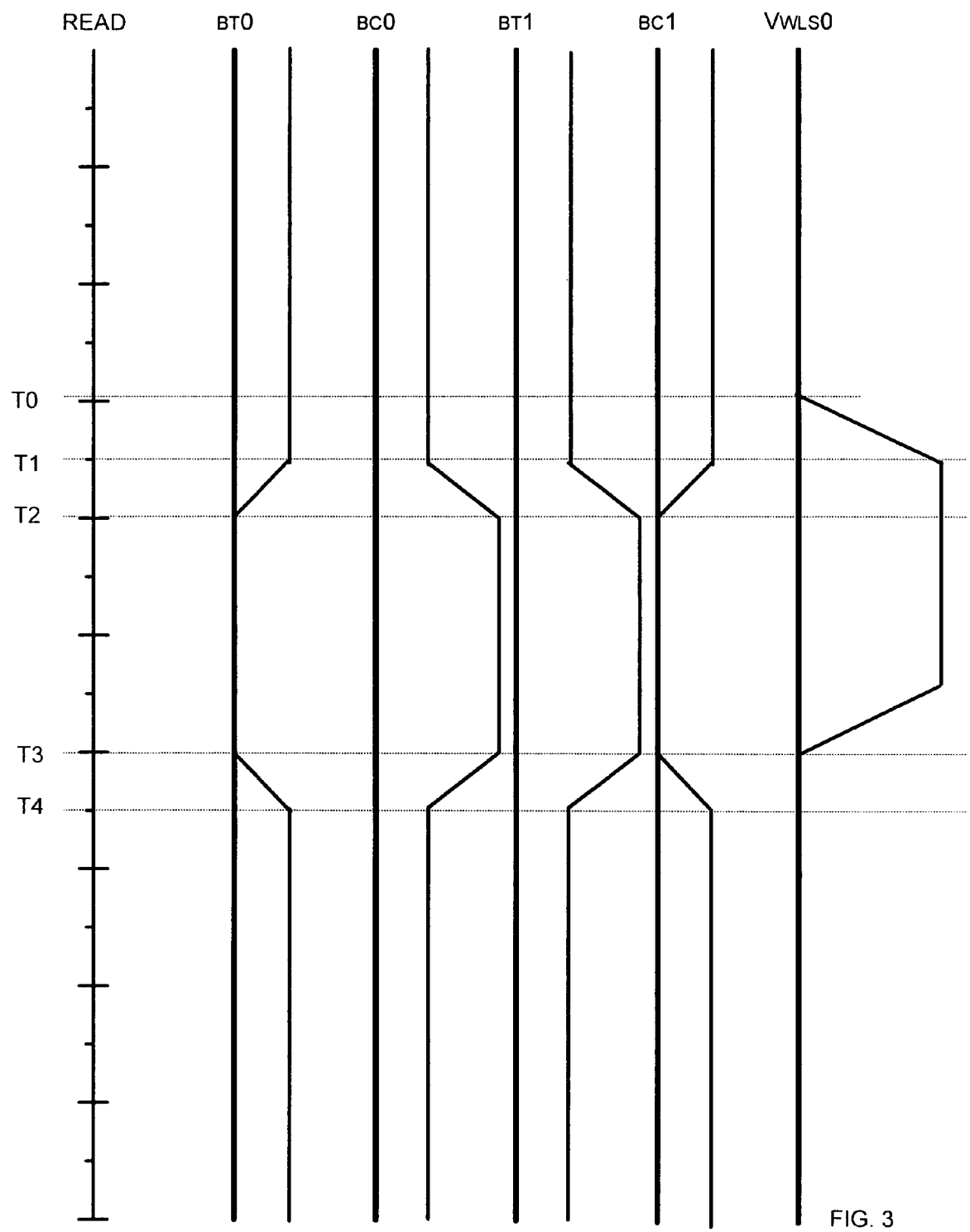
FIG. 3 is an illustration of an embodiment of signaling for a volatile READ operation.

FIG. 3 is a signal diagram showing an embodiment of signals on the bit lines BT0 and BT1, their respective compliment lines BC0 and BC1, and the volatile word line Vwls0 for a READ operation. In this embodiment each signal may have three states—high, low, and "pre-charge". For discussion assume that volatile cells 111 and 108 are read to bit lines BT0 and BT1 and complement bit lines BC0 and BC1 respectively. The zero or low state in the figures corresponds with the thick vertical base line for each signal. The pre-charge state corresponds to a voltage stepped up to approximately a half-way point between the heavy vertical lines. A one or high state is shown when the voltage appears to the farthest right of the base line for a signal. In FIG. 3 the bit lines are pre-charged (i.e. set prior to the READ operation) to the neutral state. During the pre-charge phase, the word line Vwls0 has a zero voltage. Voltage levels are relative to a ground or low supply level (i.e. Vss).

At time T0, word line Vwls0 has a voltage presented on it. At time T1, this voltage has reached its peak value. READ and WRITE operations for volatile memory may be performed at lower voltages than operations on nonvolatile cells. Thus "high" or "1" on a volatile signal line may in some embodiments (e.g. other than SONOS) be less than "high" or "1" on a nonvolatile signal line. When the word line achieves a high state, the bit line for a particular cell will assume a level corresponding to the value stored within the volatile cell. For the cell read on BT0, the stored value was zero, thus at T2 the value expressed on BT0 is zero. The compliment of this value, i.e. one, is expressed at T2 on the compliment line BC0. Volatile cell 108 stored a one value driving BT1 toward a one and BC1 to 0, starting the transition at T1 and completing at T2. Note that a sense amplifier coupled to the bit lines may facilitate driving the values to unambiguous one and zero.

At time T3, the word line Vwls0 has dropped back to state 0. At time T4, the bit and compliment lines return to the pre-charge state.

Figure 4:
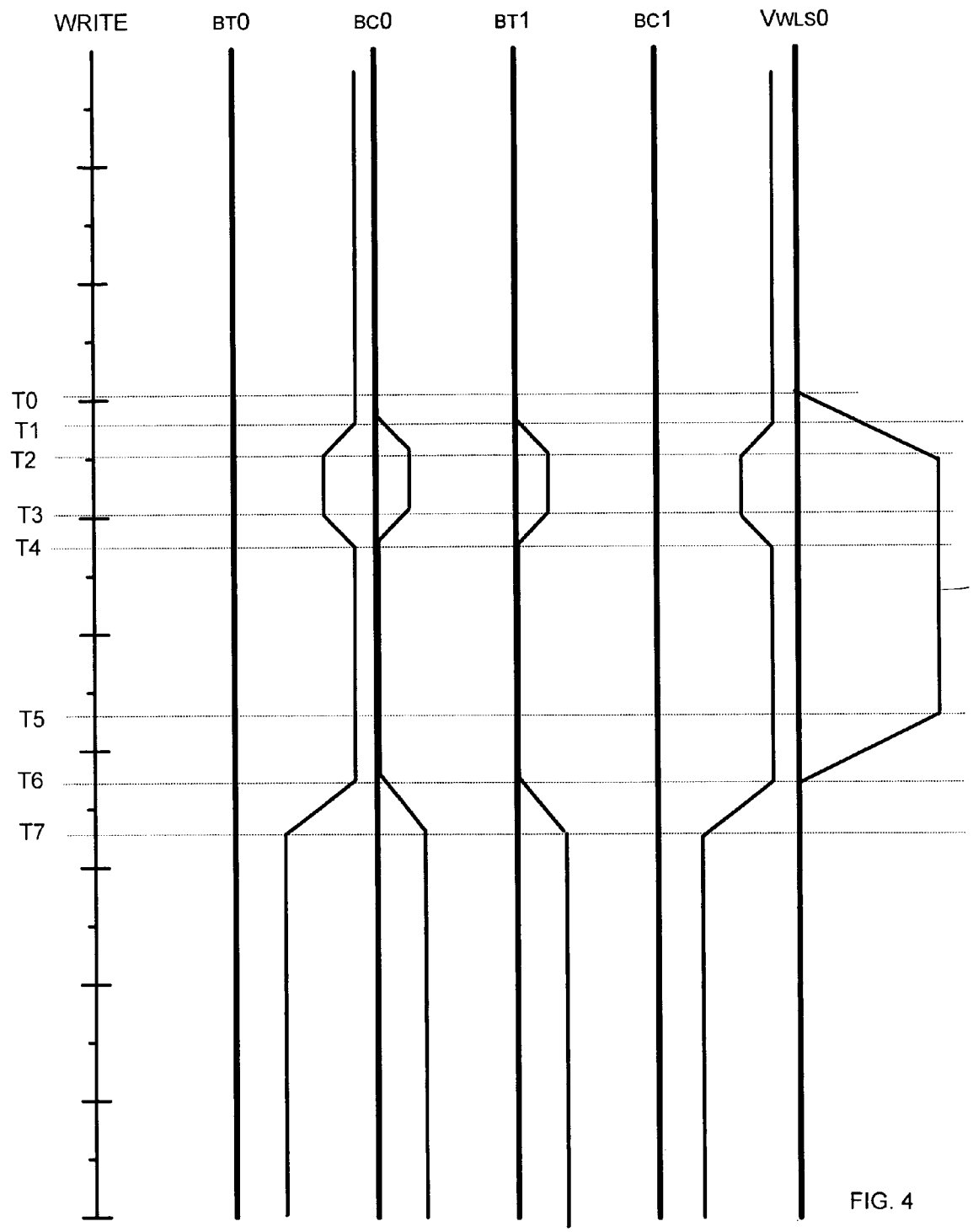
FIG. 4 is an illustration of an embodiment of signaling for a volatile WRITE operation.

FIG. 4 is an illustration of an embodiment of signaling for a volatile WRITE operation. The WRITE operation begins by applying to the bit lines BT0 BT1 the values to be stored to the volatile cells. In this example, BT0 is set to the one state and BT1 is set to the zero state. The compliment lines BC0 BC1 are set to the compliments of the values to be written to the memory cells. Because Vwls0 is not initially asserted, the values on the bit line do not cause any change to the values stored within the memory cells. At time T0, the word line Vwls0 is asserted. By T1, the voltage value stored in cell 111 begins to "pull down" the value on BT0 and "pull up" the value on BC0. At time T1 the charge value stored in cell 108 begins to "pull up" BT1 and to "pull down" BC0. In some embodiments, each volatile memory cell may comprise two pairs of cross coupled transistors with each pair acting as a current source or drain. By time T2, the pull up or pull down effects have reached their maximum value. By time T4, these effects are no longer present.

At time T5, the voltage on word line Vwls0 begins to reduce. At time T6, the voltage being asserted on Vwls0 in zero. The bit lines and compliment lines begin a pre-charge to a neutral state, which concludes at time T7.

Figure 5:
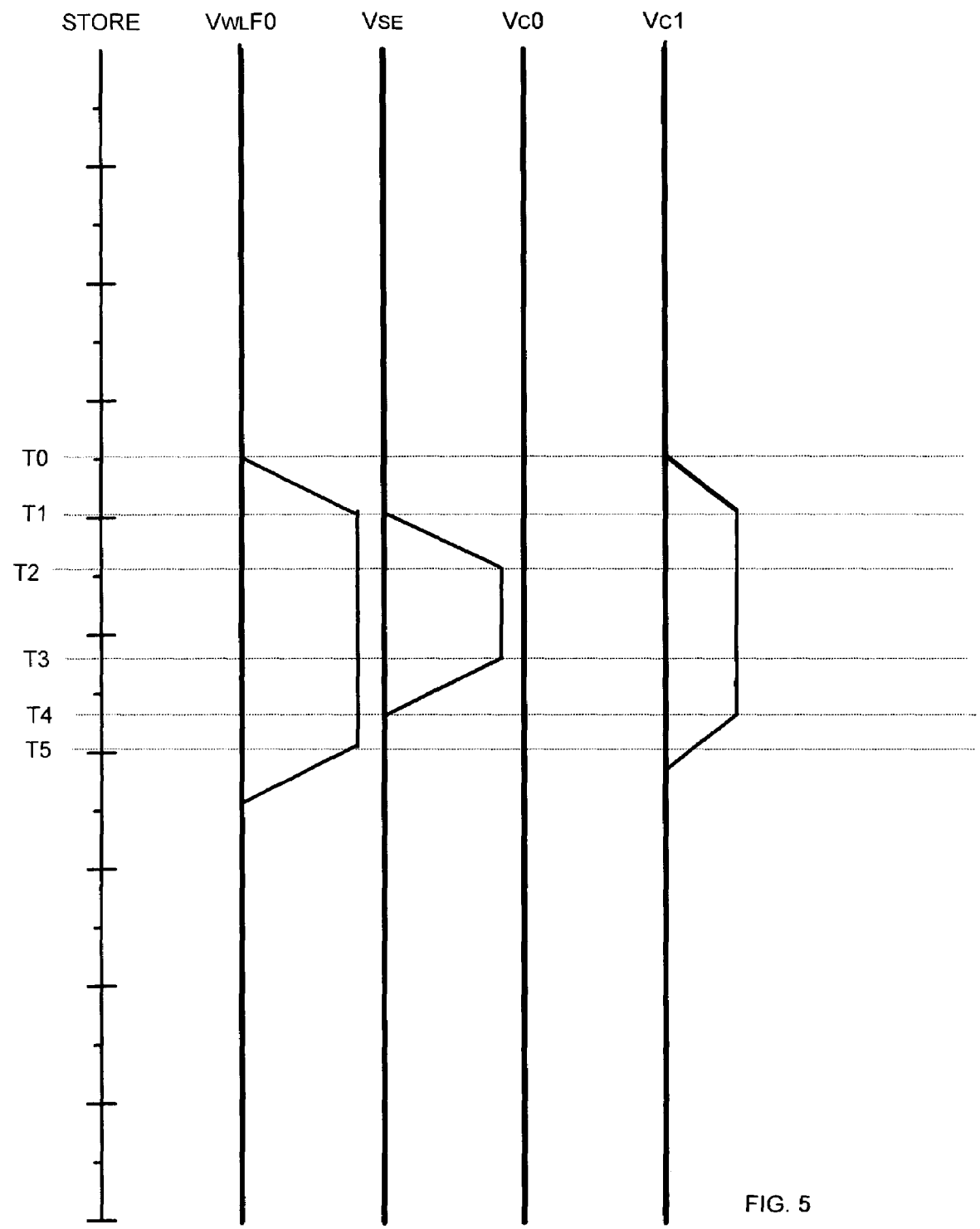
FIG. 5 is an embodiment of signaling to perform a non-volatile flash memory cell STORE operation.

FIG. 5 is an embodiment of signaling to perform a non-volatile flash memory cell STORE operation. The STORE operation is preceded by a read of the corresponding volatile memory cells. During that read, which is not shown in FIG. 4, the bit and compliment lines for the flash cells, in this case BT0, BC0, BT1, and BC1, are set to the values which are to be stored within the non-volatile memory cells. FIG. 5 illustrates the situation where BT0 is set to zero and BT1 is set to one. The word line for the flash cells, VwlF0, the voltage store/erase line for the cells Vse, and the voltage supply line for memory cell 115 VC0 and for memory cell 114 VC1 are illustrated.

Prior to time T0, none of the above lines are asserted. Between T0 and T1, the word line for the flash cells VwlF0 is driven high. The voltage line VC1 is driven high in order to store a one in the cell.

Between T1 and T2, Vse is driven high. By time T3, the flash cells store charge corresponding to the respective values of 0 and 1, the values in their associated volatile memory cells. At T3, Vse begins to drop. Between times T4 and T5 VC1 and VwlF0 also drop, and the STORE operation is complete. In some embodiments, the sense amplifier may also operate to shift the low voltage levels on BT0 and BT1 to medium voltage levels on Vc0 and Vc1.

Figure 6:
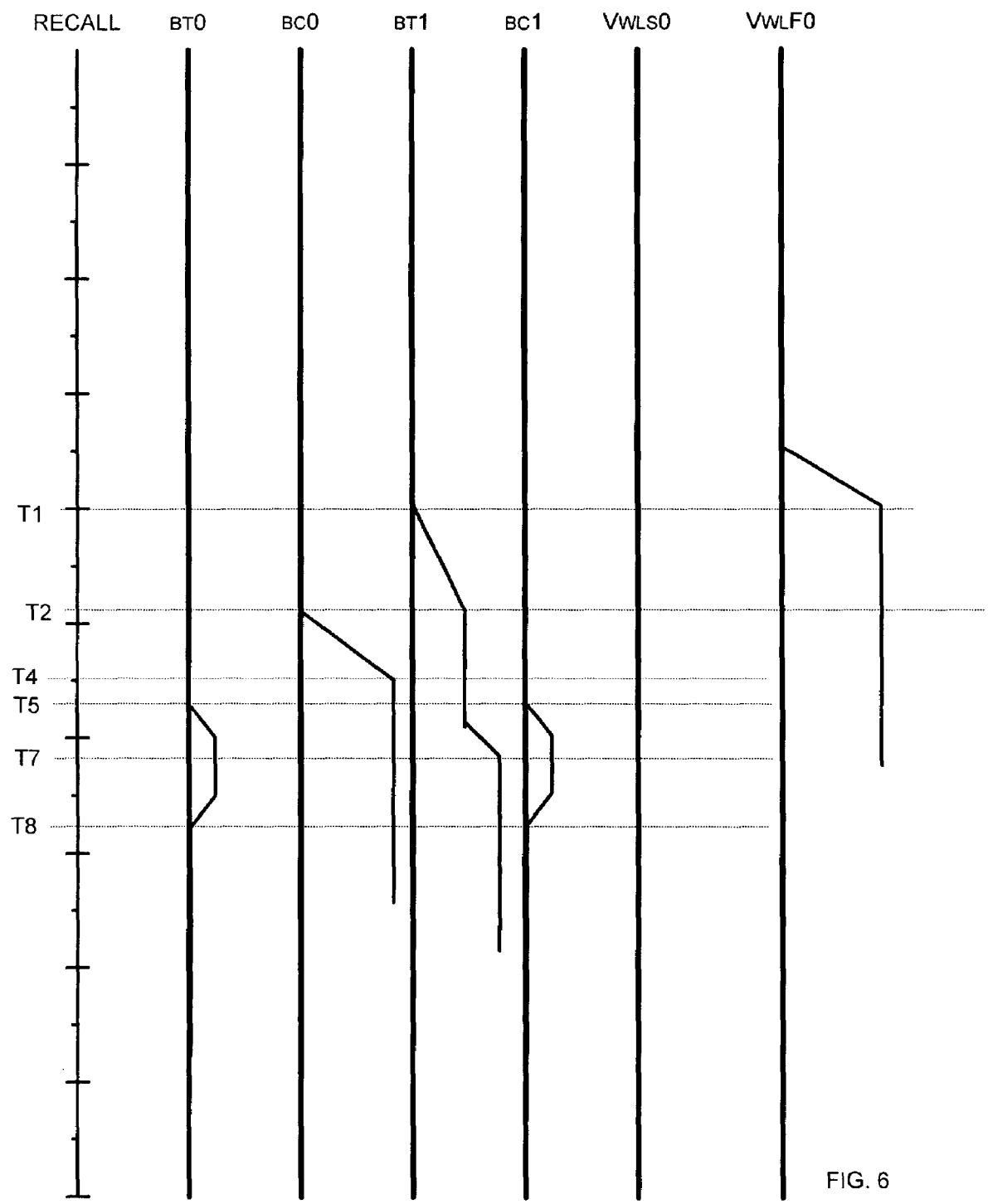
FIGS. 6 and 7 illustrate signaling for an embodiment of a non-volatile memory cell RECALL operation.
Figure 7:
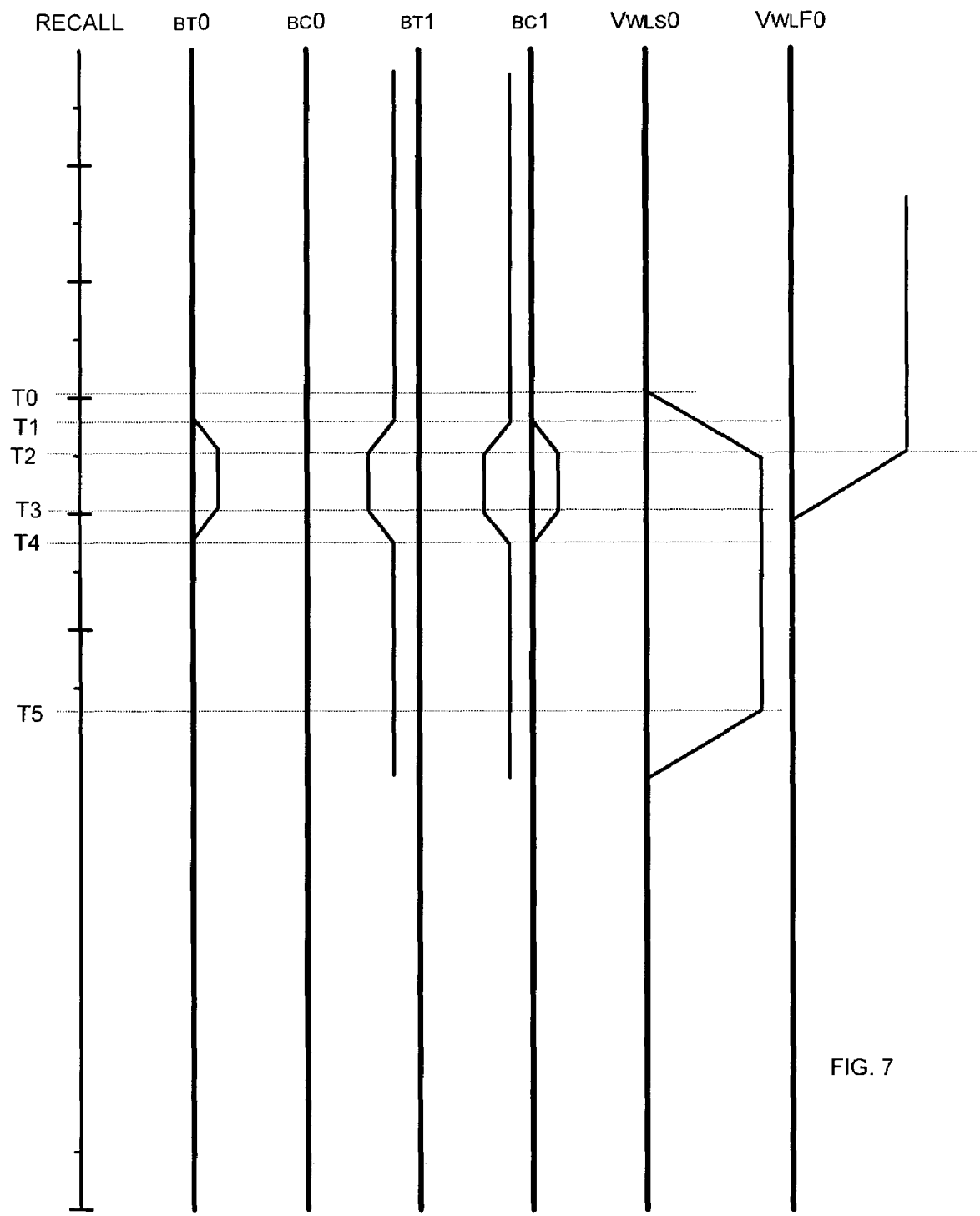

FIGS. 6 and 7 illustrate signaling for an embodiment of a non-volatile memory cell RECALL operation. The recall of data from flash memory is followed by a WRITE operation of the recalled bits into the corresponding volatile cells. In the illustrated example, a flash cell coupled to BT0 stores a zero, and a flash cell corresponding to BT1 stores a one. The bit lines and their complements are set low prior to commencing the RECALL operation. Referring to FIG. 6, the RECALL begins at time T1 with the assertion of the word line VwlF0 for the flash cells. By T2, BT1 has been pulled up by the stored high (one) voltage in the flash cell to which it is coupled and BT0 remains at zero, reflecting the low (zero) voltage stored in its associated flash cell. BT1 may in some cases be pulled to a value that reflects the supply voltage (one, or high) limited or reduced by threshold voltages of the transistor providing the charge storage. In other words, BT0 has zero voltage because its corresponding flash cell stored a zero, while BT1 is driven toward (but not to) one to reflect the one stored in its corresponding flash cell. Around T5 transient effects appear on BC1 and BT0. From T7 to T8 the transient effects dissipate, the sense amplifiers engage, and the bit lines BT0 and BT1 have voltages corresponding to the values to be set within the volatile memory later on. VwlF0 will start to fall and is zero at T8. VwlF0 may stay high without influencing the upcoming WRITE of the bit line values to the volatile cells.

FIG. 7 illustrates signaling for an embodiment of a second part of a RECALL operation during which values obtained from the flash cells are written into corresponding volatile memory cells. This writing of SRAM from the associated flash cells is similar to the WRITE operation described earlier in conjunction with FIG. 4. As before, the word line for the volatile memory Vwls0 is asserted to drive the values present on the bit lines into the volatile memory cells. Transient effects on the bit and compliment lines result from energy shifts (cross currents) between the transistors and the bit lines. By T4 the transient effects have dissipated and the volatile cells store the values presented on the bit lines.

Figure 8:
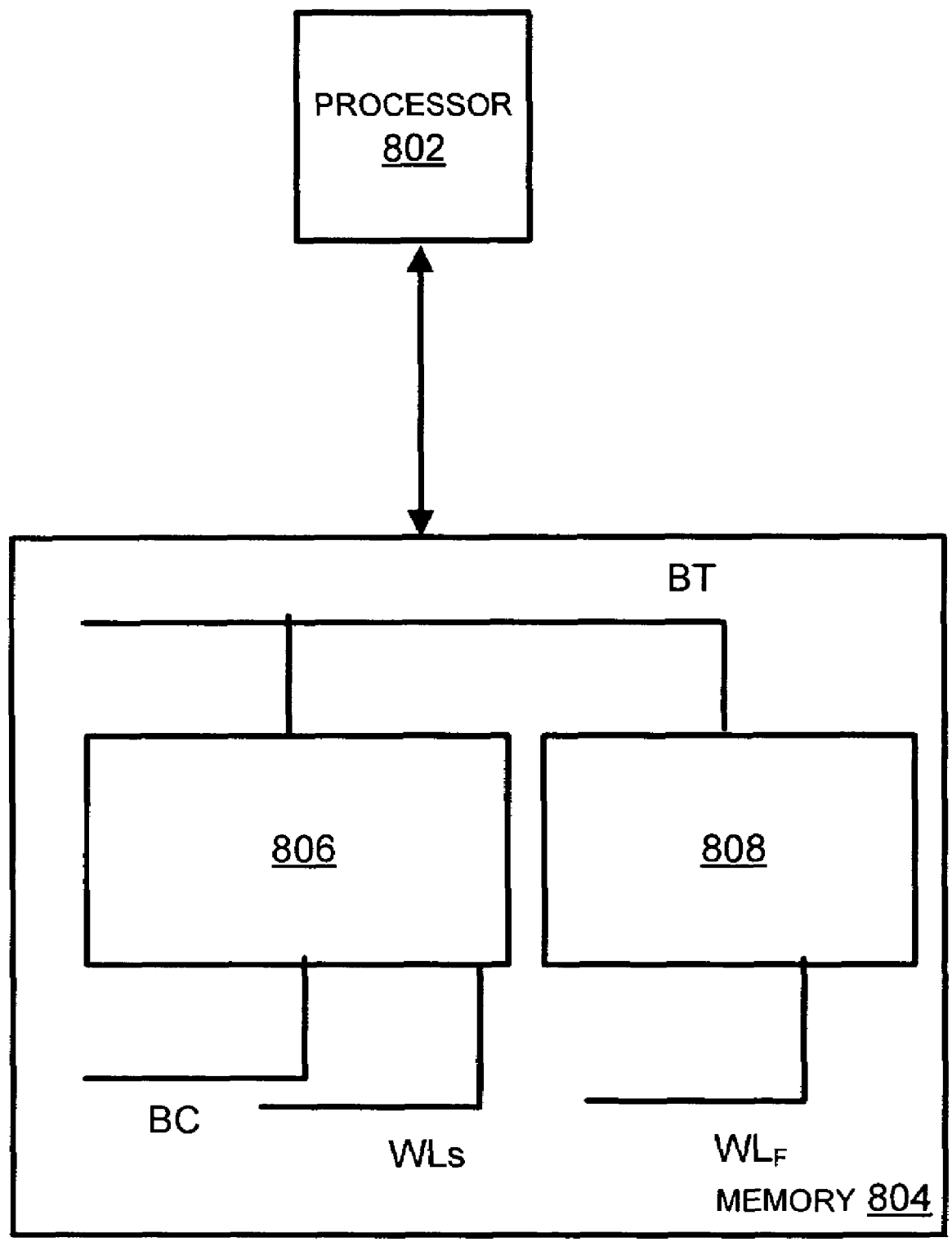
FIG. 8 is a block diagram of an embodiment of a computing system including an integrated volatile-nonvolatile memory.

FIG. 8 is a block diagram of an embodiment of a computing system including an integrated volatile-nonvolatile memory. The computing system will typically comprise at least one processor 802, for example a general purpose microprocessor, an embedded special-purpose processor, a digital signal processor, and so on. The processor 802 may interact with a memory 804 to read and write data during system operation. The memory may comprise volatile region 806 and nonvolatile region 808. Cells of the volatile region 806 may have corresponding cells in the nonvolatile region 808. In the course of operation, or upon imminent loss of system power, data may be stored from the volatile region 806 to the non-volatile region 808. The volatile 806 and nonvolatile 808 regions may communicate via the bit lines BT and corresponding subregions may have corresponding word lines WLs and WL$_F$ to accomplish the pairing of volatile and non-volatile cells.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory circuit comprising:
volatile memory cells coupled to bit lines; and
nonvolatile memory cells coupled to the volatile memory cells via unswitched bit line connections, but not via complement bit lines.

2. The memory circuit of claim 1, further comprising:
the volatile cells and the nonvolatile cells each coupled to a sense amplifier with level shifting capabilities, the volatile cells coupled to the sense amplifier via the bit lines and complement bit lines, and the nonvolatile cells coupled to the sense amplifier via the bit lines but not via the complement bit lines.

3. The memory circuit of claim 1, wherein the volatile memory cells coupled to bit lines further comprise:
SRAM cells.

4. The memory circuit of claim 1, wherein the volatile memory cells coupled to bit lines further comprise:
DRAM cells.

5. The memory circuit of claim 1, wherein the volatile memory cells coupled to bit lines further comprise:
SRAM cells coupled to the bit lines and to complements of the bit lines.

6. The memory circuit of claim 1, wherein the nonvolatile memory cells coupled to the volatile memory cells further comprises:
FLASH memory cells.

7. The memory circuit of claim 6, wherein the FLASH memory cells further comprise:
FLASH cells comprising at least one SONOS transistor.

8. The memory circuit of claim 1, wherein the nonvolatile memory cells coupled to the volatile memory cells further comprises:
each nonvolatile cell coupled to multiple volatile cells;
each nonvolatile cell coupled to a nonvolatile word line corresponding to a volatile word line; and
the volatile word line coupled to only one of the volatile cells to which the nonvolatile cell is coupled.

9. A computer system comprising:
a processor coupled to a memory circuit, the memory circuit comprising:
volatile memory cells coupled to bit lines;
nonvolatile memory cells coupled to the volatile memory cells via the bit lines but not via complement bit lines; and
nondifferential sense amplifiers coupled to bit lines.

10. The system of claim 9, wherein the volatile memory cells coupled to bit lines further comprises:
SRAM cells.

11. The system of claim 9, wherein the volatile memory cells coupled to bit lines further comprises:
SRAM cells coupled to the bit lines and to complements of the bit lines.

12. The system of claim 9, wherein the nonvolatile memory cells coupled to the volatile memory cells further comprises:
FLASH memory cells coupled to the bit lines but not to complement bit lines.

13. The system of claim 12, wherein the flash memory cells further comprise:
FLASH cells comprising at least one SONOS transistor.

14. The system of claim 9, wherein the nonvolatile memory cells coupled to the volatile memory cells further comprises:
each nonvolatile cell coupled to multiple volatile cells;
each nonvolatile cell coupled to a nonvolatile word line corresponding to a volatile word line; and
the volatile word line coupled to only one of the volatile cells to which the nonvolatile cell is coupled.

15. A method of operating a memory circuit to store data from volatile memory to nonvolatile memory, comprising:
operating the volatile memory to cause data values stored in the volatile memory to be represented on bit lines; and
setting supply voltages of the nonvolatile memory to cause values from the bit lines to be stored by the nonvolatile memory without applying to the nonvolatile memory complements of the values represented on the bit lines.

16. The method of claim 15, further comprising:
for each nonvolatile memory cell, operating a pair of transistors coupled between a bit line and the supply voltage for the cell.

17. The method of claim 16, further comprising:
for each nonvolatile memory cell, operating at least one SONOS transistor.

18. The method of claim 16, further comprising:
simultaneously asserting word lines for corresponding regions of the volatile and nonvolatile memories.

19. A method of operating a memory circuit to read data from nonvolatile memory to volatile memory, comprising:
operating the nonvolatile memory to cause data values stored in the nonvolatile memory to be represented on bit lines but not on complement bit lines;
passing the data values from the nonvolatile memory to the volatile memory via unswitched bit lines; and operating a differential amplifier to cause the data values represented on the bit lines to be stored in the volatile memory.

20. The method of claim 19, wherein operating the nonvolatile memory further comprises:

operating flash memory comprising at least one SONOS transistor per cell.

21. The method of claim 19, further comprising:

simultaneously asserting word lines for corresponding regions of the volatile and nonvolatile memories.

* * * * *